(12) United States Patent
Gentner et al.

(10) Patent No.: US 11,808,808 B2
(45) Date of Patent: Nov. 7, 2023

(54) TESTING A SINGLE CHIP IN A WAFER PROBING SYSTEM

(71) Applicant: INTERNATIONAL BUSINESS MACHINES CORPORATION, Armonk, NY (US)

(72) Inventors: Thomas Gentner, Boeblingen (DE); Alejandro Alberto Cook Lobo, Stuttgart (DE); Otto Andreas Torreiter, Leinfelden-Echterdingen (DE)

(73) Assignee: International Business Machines Corporation, Armonk, NY (US)

( * ) Notice: Subject to any disclaimer, the term of this patent is extended or adjusted under 35 U.S.C. 154(b) by 14 days.

(21) Appl. No.: 17/643,216

(22) Filed: Dec. 8, 2021

(65) Prior Publication Data

US 2023/0176116 A1    Jun. 8, 2023

(51) Int. Cl.
*G01R 31/28* (2006.01)

(52) U.S. Cl.
CPC ..... *G01R 31/2893* (2013.01); *G01R 31/2891* (2013.01)

(58) Field of Classification Search
CPC ................................................ G01R 31/2893
USPC .................................................... 324/750.23
See application file for complete search history.

(56) References Cited

U.S. PATENT DOCUMENTS

| | | | |
|---|---|---|---|
| 4,966,520 A | 10/1990 | Yokota | |
| 6,021,380 A | 2/2000 | Fredriksen | |
| 6,541,989 B1 | 4/2003 | Norris | |
| 6,563,331 B1* | 5/2003 | Maeng | G01R 1/0408 324/759.02 |
| 8,703,508 B2 | 4/2014 | Chang | |
| 9,885,748 B2 | 2/2018 | Eckert | |
| 2001/0050567 A1 | 12/2001 | Bachelder | |

(Continued)

FOREIGN PATENT DOCUMENTS

| | | |
|---|---|---|
| CN | 103575938 A | 2/2014 |
| CN | 107504896 A | 12/2017 |
| CN | 111273162 A | 6/2020 |

(Continued)

OTHER PUBLICATIONS

Espacenet Translation: JP2016197689A Semiconductor Testing Jig, and Method of Testing Semiconductor Device (Year: 2016).*

(Continued)

*Primary Examiner* — Jermele M Hollington
*Assistant Examiner* — Courtney G McDonnough
(74) *Attorney, Agent, or Firm* — Daniel J. Hakimi

(57) ABSTRACT

A method for testing at least one single chip in a wafer probing system, at least comprising: providing an adapter plate having an interface surface for contacting a vacuum chuck of the wafer probing system, the adapter plate being configured to accommodate the at least one single chip in a cutout with a chip rear surface being flush with the interface surface; loading the adapter plate with the at least one single chip into the wafer probing system; determining an exact position of the at least one single chip in the adapter plate in the search area; and testing the at least one single chip with test routines stored in a controller of the wafer probing system. A device and an adapter plate for testing at least one single chip in a wafer probing system.

25 Claims, 8 Drawing Sheets

(56) References Cited

U.S. PATENT DOCUMENTS

| | | | |
|---|---|---|---|
| 2013/0181735 A1* | 7/2013 | Horino | G01R 31/2891 324/750.13 |
| 2021/0215738 A1 | 7/2021 | Torreiter | |

FOREIGN PATENT DOCUMENTS

| | | | |
|---|---|---|---|
| CN | 111308325 A | 6/2020 | |
| CN | 113504459 A | 10/2021 | |
| JP | 5528617 B1 * | 6/2014 | G01R 31/26 |
| JP | 2016197689 A * | 11/2016 | G01R 31/26 |

OTHER PUBLICATIONS

JP 5528617 B1 Probing Unit, Burn-In Screening System Using Probing Unit, and Burn-In Screening Method (Year: 2014).*

Author Unknown, "Find Image Rotation and Scale Using Automated Feature Matching," MathWorks, Accessed: Nov. 5, 2021, https://www.mathworks.com/help/vision/ug/find-image-rotation-and-scale-using-automated-feature-matching.html, 6 pages.

Marinissen et al., "Automated Testing of Bare Die-to-Die Stacks," SW Test Workshop, CascadeMicrotech, Jun. 5-8, 2016, http://www.swtest.org/swtw_library/2016proc/PDF/S01_03_Rishavy_SWTW2016.pdf, 25 pages.

Saez, Correcting Image Orientation Using Convolutional Neural Networks—A hands-on introduction to deep learning applications, DISQUS, Jan. 12, 2017, https://d4nst.github.io/2017/01/12/image-orientation/, 39 pages.

Whittaker, "Probe Testing of Wafer Level Chip Scale Packaging," High Frequency Electronics, Accessed: Nov. 3, 2021, https://www.highfrequencyelectronics.com/Oct11/1110_HFE_WaferProbe.pdf, 4 pages.

"Patent Cooperation Treaty PCT International Search Report", International Application No. PCT /IB2022/060770, International Filing Date: Nov. 9, 2022, dated Feb. 24, 2023, 9 pages.

* cited by examiner

TESTING A SINGLE CHIP IN A WAFER PROBING SYSTEM

The present invention relates generally to the manufacturing of semiconductor devices and, more particularly, to a method and a device for testing at least one single chip in a wafer probing system.

BACKGROUND

Today's semiconductor devices are usually manufactured as multiple dies (commonly also referred to as dice or chips) that are formed in parallel on a large, even, thin, often circular or clipped circular semiconductor wafer. After manufacturing of the devices, they are tested for the first time on the still intact, undiced wafer before the wafer is cut into typically rectangular pieces representing the single dies. These chips usually need to be mounted onto a module substrate (e.g., by a soldering process) that typically consists of a ceramic or organic material, before it can be connected again to another test system or even plugged into the final product.

Electronic circuits formed on a wafer are typically tested using a wafer probing system that consists of an automatic wafer loader adapted for picking single wafers out of a wafer cartridge, a theta pre-align system to adjust the in-plane wafer rotation, a vacuum chuck onto which the single wafer gets loaded, and a wafer prober unit comprising a probe card with electrical contacting pins. The position of the chuck can usually be set with a micrometer-range precision in three independent spatial directions x, y, z; the chuck may further be thermally controlled and connected to a vacuum system so the wafer can be secured to the chuck using an under-pressure on its front side. After establishing an electrical contact to the die contacts using the probe card, the functioning of the dies can be tested using, e.g., automated test equipment.

U.S. Pat. No. 6,541,989 B1 discloses a testing device for semiconductor components. The testing device includes a support structure having an outer edge, and an adhesive film disposed on the support structure to hold a semiconductor wafer in position on the support structure so that neither the adhesive film nor the semiconductor wafer extends beyond the outer edge of the support structure.

U.S. Pat. No. 8,703,508 B2 discloses a method for wafer level testing diced multi-chip stacked packages. Firstly, the plurality of multi-chip packages are provided where each multi-chip package includes a plurality of chips vertically stacked together and each multi-chip package has a top surface, a bottom surface, and a plurality of testing electrodes disposed on the top surface. Then, according to a die-on-wafer array arrangement, the multi-chip stacked packages are fixed on a transparent reconstructed wafer where the transparent reconstructed wafer has a photosensitive adhesive and includes a plurality of component placement regions defined by a plurality of specific alignment marks such as a chip array defined by X-axes and Y-axes, central alignment marks, corner alignment marks, or peripheral alignment marks. The photosensitive adhesive adheres to the bottom surfaces of the multi-chip stacked packages so that the multi-chip stacked packages are located inside the component placement regions without covering the X-axes and Y-axes, the corner alignment marks, or the peripheral alignment marks. Then, the transparent reconstructed wafer with the adhered multi-chip stacked packages is loaded into a wafer tester. Then, the testing electrodes of the multi-chip stacked packages are probed by a plurality of probes of a probe card installed inside the wafer tester to electrical test the multi-chip stacked packages to screen out good packages from bad packages before surface mounting.

Thus, according to state of the art, existing wafer chucks can mount complete wafers with the help of a vacuum using a wafer chuck with vacuum grooves. Diced wafers/chips are typically tested with special equipment that can handle single chips. The wafer is put onto the chuck and it is held in place by a strong vacuum. A further application may be a so-called wet-mode configuration which uses a coolant that circulates between the wafer and the chuck. Wet-mode is used for better thermal contact between wafer and chuck. So-called broken wafer kits can be used to mount parts of wafers or single chips onto an intermediate plate.

SUMMARY

According to an embodiment of the present invention, a method is proposed for testing at least one single chip in a wafer probing system, at least comprising: (i) providing an adapter plate having an interface surface for contacting a vacuum chuck of the wafer probing system, the adapter plate being configured to accommodate the at least one single chip in a cutout with a chip rear surface being flush with the interface surface; (ii) loading the adapter plate with the at least one single chip into the wafer probing system; (iii) reading an identification data of the loaded adapter plate; (iv) storing the identification data of the loaded adapter plate in a controller of the wafer probing system; (v) moving the vacuum chuck together with the adapter plate to a predefined search area for probes of the wafer probing system; (vi) determining an exact position of the at least one single chip in the adapter plate in the search area; (vii) adjusting the position of the vacuum chuck until a front surface of the at least one single chip is in an operational region for being contacted by the probes of the wafer probing system; (viii) adding the adjusted position of the vacuum chuck corresponding to the at least one single chip positioned in the operational region to the stored identification data of the loaded adapter plate; (ix) contacting the at least one single chip electrically with probes of the wafer probing system; (x) testing the at least one single chip with test routines stored in a controller of the wafer probing system.

The proposed method allows for testing a single chip of a dedicated size on a standard wafer probing system. The wafer probing system at least comprises a vacuum chuck onto which the adapter plate gets loaded, a positioning system for the vacuum chuck and a wafer prober unit comprising a test system with electrical contacting pins.

Further, it is possible to test multiple detached chips of a diced wafer of the same type. The method allows for finding the target chip on the adapter plate in an easy way. Advantageously a better thermal connection to the cooling equipment of the wafer probing system may be achieved than with existing solutions. Additional wet-mode testing is possible direct to the chip under test. The chip under test is protected against moving by contact forces performed by the probe. A rigidity of the adapter plate may be a benefit while inserting and moving the adapter plate into the wafer probing system. No interference with existing tool handling or automated test algorithms for single-chip occurs. Built adapter plates may be archived to meet ISO 93000 criteria.

According to an embodiment of the proposed method a wafer-sized adapter plate is used to cover the vacuum chuck. The adapter plate has at least one cutout which is a little bigger than the size of the chip under test. An appropriate adhesive may be used for fixing the chips under test in the respective opening of the cutout. The thickness of the adapter plate is slightly less than the thickness of the chip under test.

Advantageously the adapter plate, the adhesive and the chip create a vacuum-tight barrier so that all the vacuum ducts of the vacuum chuck are covered. The rear side of the chip under test has direct thermal contact to the vacuum chuck. Thus, cooling by the vacuum chuck during operation of the chip is enhanced. A coolant in wet-mode may even circulate directly at the chip. The rear surface of the adapter plate is smooth and adapted for a vacuum tight arrangement on the vacuum chuck.

A change of the chip can be done by a new adapter plate or by using an appropriate solvent for the adhesive. Adapter plates can be used like standard wafers.

Each adapter plate has a unique prober-readable identification data, such as labelling, for plate type and identification.

A maximum thickness of the adapter plate may be the chip thickness. Special edge shapes/ducts can be used to support properties of the adhesive.

In at least one embodiment, the adapter plate can be customized for specific purposes to reduce test time. Multiple pre-tested chips with a specific property can be accommodated on one adapter plate.

By rapid prototyping of adapter plates a re-arrangement/replacement of chips on the adapter plate may easily be achieved.

By an efficient testing of single chips a better archiving of the tested chips is possible, because it can be sorted by chips that share specific properties.

Testing with the proposed method may seamlessly integrate into a standard test flow.

In an embodiment of the invention, additionally or alternatively the steps (v) to (x) may be repeated for every single chip that is mounted to the loaded adapter plate. By this way effective testing of a number of chips of a diced wafer can be completed in a reasonable amount of time.

In an embodiment of the invention, additionally or alternatively further at least chip parameters may be acquired, in particular a chip position and/or a rotation angle on the adapter plate, in a determination phase of a positioning algorithm.

To support auto-levelling and correct chip map stepping of the adapter plate on the vacuum chuck the distance and angle recognition system of the wafer probing system may support the adapter plate. For the single chip application the existing positioning algorithm for legacy broken wafer kits can be used. For an apparatus with multiple cutouts in a regular grid with columns and rows the positioning algorithm may be adapted to find the correct chip locations on the adapter plate. For testing a first chip pin needs to always be at the same relative location, e.g. at a top-left position of the chip.

In an embodiment of the invention, additionally or alternatively the method may further comprise: defining a pattern on a front surface of the at least one single chip which is suitable for adjusting the position and/or the rotation angle of the at least one single chip. Thus, in a determination phase the exact coordinates of the chip on the adapter plate can be determined.

In an embodiment of the invention, additionally or alternatively the method may further comprise: (i) determining the exact position of the at least one single chip manually with a camera system or (ii) determining the exact position of the at least one single chip automatically with a camera system or (iii) determining the exact position of the at least one single chip automatically with a camera system and the positioning algorithm. In at least one embodiment, a camera system may be used for position determination. In wafer probing system according to state of the art such an optical determination can be carried out in an automated or semi-automated manner.

In an embodiment of the invention, additionally or alternatively the pattern may comprise topological features on the front surface of the at least one single chip, in particular features such as soldering balls and/or optical high contrast structures.

The positioning of the probe of the wafer probing system and the step coordinates in the wafer probing system according to state of the art are typically learned from saw marks on the wafer. For single chip probing with the adapter plate, this is no longer suitable, since the saw mark does not exist anymore. For this purpose the outer soldering balls and neighboring optical high contrast structures may be used as a chip boundary indicator.

In an embodiment of the invention, additionally or alternatively at least one search area may be defined for finding a match of the pattern with the position of the at least one single chip. The positioning algorithm of the wafer probing system may try to find a match of the structures in a certain search area.

In an embodiment of the invention, additionally or alternatively the search area may be defined for each corner of a rectangular chip. This way, exact coordinates of the chip position may be determined in order to get adjustment values for adjusting the position of the vacuum chuck such that successful probing of the chip may be achieved.

In an embodiment of the invention, additionally or alternatively at least a chip position and/or a rotation angle may be determined from a match of the at least one search area with the pattern and stored to a product data database. Thus, exact coordinates of the chip position may be determined in order to get adjustment values for adjusting the position of the vacuum chuck such that successful probing of the chip may be achieved.

In an embodiment of the invention, additionally or alternatively a feature matching algorithm may be used in the determination phase of the positioning algorithm extracting feature points of an optical image of the at least one single chip for determining a translational and rotational matrix defining adjusting positions of the vacuum chuck.

Applying a feature matching algorithm which extracts feature points of an image and an identical one that is rotated and/or translated may be used. Then these features are matched to pairs of identical features on both images. From these matched pairs a translational and rotational matrix can be determined.

In an embodiment of the invention, additionally or alternatively a neural network, in particular a convolutional neural network, may be used in the determination phase of the positioning algorithm for determining a translational and rotational matrix defining adjusting positions of the vacuum chuck.

Using a Convolutional Neural Network (CNN) which is trained on finding a rotational and/or translational distortion of image pairs may also be favorable. Upright chip images can be used as a dataset of samples and their ground truth. In this case images with their angles of orientation of zero degrees and frame-centered images, which means not translated, may be used. The results of this CNN can also be used to determine a translational and rotational matrix defining adjusting positions of the vacuum chuck.

In an embodiment of the invention, additionally or alternatively the identification data, may provide at least a plate type and/or a unique identification and/or coordinates of the at least one cutout for the at least one single chip. Thus, chip positions and orientations may be stored in a controller of the wafer probing system and used for adjusting the position of the vacuum chuck for a correct probing of the chip under test.

In an embodiment of the invention, additionally or alternatively the identification data may at least provide a unique product name, a fixed identifier, grid step sizes, an origin point of a top left position of a cutout on the adapter plate, opening dimensions of one or more cutouts, and a number of cutouts in different directions of the surface of the adapter plate.

Identification data can be an adapter plate label, which may be formatted as $$<name>\_mcap\_<dw>x<dh>+<ox>+<oy>\_<w'>x<h'>\_<\#w>x<\#h>, \text{ where}$$

<name>: a unique product name
mcap: fixed identifier→this is a multi-chip adapter plate (software hint)
<dw>x<dh>: grid step sizes
<ox>+<oy>: origin point of pos11 position on the adapter plate (base point of $d_w, d_h$)
<w'>x<h'>: opening dimensions
<#w>x<#h>: number of chips in orthogonal directions w and h.

Further, a device is proposed for testing at least one single chip in a wafer probing system with a method, providing: (i) an adapter plate for accommodating at least one single chip in a cutout of the adapter plate with a rear surface of the at least one chip being flush with an interface surface of the adaption plate, (ii) a vacuum chuck for applying vacuum to the adapter plate, (iii) probes of the wafer probing system for testing the at least one single chip mounted to the adapter plate, (iv) a single chip fixing means for fixing the at least one single chip in the cutout of the adapter plate in a vacuum-tight manner, the fixing means additionally applied to the at least one single chip arranged in the cutout.

The proposed device allows for testing a single chip of a dedicated size on a standard wafer probing system. Further it is possible to test multiple detached chips of a diced wafer of the same type. The device allows for finding the target chip on the adapter plate in an easy way. Advantageously a better thermal connection to the cooling equipment of the wafer probing system may be achieved than with existing solutions. Additional wet-mode testing is possible direct to the chip under test. The chip under test is protected against moving by contact forces performed by the probe. In an embodiment, a rigidity of the adapter plate may be a benefit while inserting and moving the adapter plate into the wafer probing system. No interference with existing tool handling or automated test algorithms for single-chip occurs. Built adapter plates may be archived to meet ISO 93000 criteria.

According to an embodiment of the proposed device a wafer-sized adapter plate is used to cover the vacuum chuck. The adapter plate has at least one cutout which is a little bigger than the size of the chip under test. An appropriate adhesive may be used for fixing the chips under test in the respective opening of the cutout. The thickness of the adapter plate is slightly less than the thickness of the chip under test.

Advantageously the adapter plate, the adhesive and the chip create a vacuum-tight barrier so that all the vacuum ducts of the vacuum chuck are covered. The rear side of the chip under test has direct thermal contact to the vacuum chuck. Thus, cooling by the vacuum chuck during operation of the chip is enhanced. A coolant in wet-mode may even circulate directly at the chip.

A chip change can be done by a new adapter plate or by using an appropriate solvent for the adhesive. Adapter plates can be used like standard wafers.

Each adapter plate has a unique prober-readable identification data, e.g. such as labelling, for plate type and identification.

A maximum thickness of the adapter plate may be the chip thickness. Special edge shapes/ducts can be used to support properties of the adhesive.

In an embodiment, the adapter plate can be customized for specific purposes to reduce test time. Multiple pre-tested chips with a specific property can be accommodated on one adapter plate.

By rapid prototyping of adapter plates a re-arrangement/replacement of chips on the adapter plate may easily be achieved.

In an embodiment, a direct thermal contact with the rear side of the at least one single chip with the vacuum chuck may be achieved which ensures efficient cooling of the chip under test.

In an embodiment of the invention, additionally or alternatively the fixing means may comprise an adhesive. Standard adhesives, in particular ultraviolet curing adhesives, e.g. Loctite® 139 (Loctite and all Loctite-based trademarks and logos are trademarks or registered trademarks of Henkel AG & Co. KGaA and/or its affiliates) may be used for a reliable fixing of the chip in the cutout of the adapter plate. Thus, any movements of the chip during probing can be avoided.

In an embodiment of the invention, additionally or alternatively the cutout may have side walls being shaped as straight side walls or inclined side walls or convex side walls or concave side walls or stepped side walls. In an embodiment, special edge shapes and/or ducts may be used to support properties of the chosen adhesive for fixing the chips in the cutout of the adapter plate.

In an embodiment of the invention, additionally or alternatively the cutout may be provided with at least an alignment means on a side wall of the cutout. In particular the at least one alignment means may comprise a spring element. The alignment means may push the chip in a defined way to the side wall of the cutout. Thus, the side wall may serve as a reference for determination of the chip position.

In an embodiment of the invention, additionally or alternatively at least one corner relief may be provided in a corner connecting neighboring side walls of the cutout. The corner relief may serve for proper alignment of the chip to side walls in two rectangular dimensions of the cutout.

In an embodiment of the invention, additionally or alternatively the adapter plate may be configured with dimensions of a standard semiconductor wafer, In particular the adapter plate may have a maximum thickness being equal to a thickness of the at least one single chip. Thus, the adapter plate may be mounted instead of a standard wafer to the vacuum chuck of the standard wafer probing system. In an embodiment, adaptation of the wafer probing system for testing the single chips may be minimized.

In an embodiment of the invention, additionally or alternatively the rear surface of the at least one single chip may be in direct thermal contact with the vacuum chuck. Thus, cooling by the vacuum chuck during operation of the chip is enhanced.

In an embodiment of the invention, additionally or alternatively the at least one single chip may be cooled by a coolant, in particular in wet-mode circulating directly at the chip. Thus, cooling by the vacuum chuck during operation of the chip is enhanced.

In an embodiment of the invention, additionally or alternatively the adapter plate may be configured with a unique identification data, e.g. a label, providing at least a plate type and/or a unique identification and/or coordinates of the at least one cutout for at least one single chip. Thus, chip positions and orientations may be stored in a controller of the wafer probing system and used for adjusting the position of the vacuum chuck for a correct probing of the chip under test.

In an embodiment of the invention, additionally or alternatively further the identification data, e.g. label, may at least provide a unique product name, a fixed identifier, grid step sizes, an origin point of a top left position of a cutout on the adapter plate, opening dimensions of one or more cutouts, and a number of cutouts in different directions of the surface of the adapter plate. Thus, all necessary information for testing the single chips in the standard wafer probing system may be provided by a standardized identification data of the adapter plate to the controller of the wafer probing system.

Further, an adapter plate is proposed for a device for testing at least one single chip in a wafer probing system, the adapter plate at least providing: at least one cutout in the adapter plate for accommodating the at least one single chip, an interface surface of the adapter plate intended to being flush with a rear surface of the at least one chip, the interface surface being configured for being mounted on a vacuum chuck for applying vacuum to the adapter plate.

The proposed adapter plate allows for testing a single chip of a dedicated size on a standard wafer probing system. Further it is possible to test multiple detached chips of a diced wafer of the same type. The adapter plate allows for finding the target chip in an easy way. Advantageously a better thermal connection to the cooling equipment of the wafer probing system may be achieved than with existing solutions. Additional wet-mode testing is possible direct to the chip under test. The chip under test is protected against moving by contact forces performed by the probe. A rigidity of the adapter plate may be a benefit while inserting and moving the adapter plate into the wafer probing system. No interference with existing tool handling or automated test algorithms for single-chip occurs. Built adapter plates may be archived to meet ISO 93000 criteria.

The wafer-sized adapter plate may be used to cover a vacuum chuck. The adapter plate has at least one cutout which is a little bigger than the size of the chip under test. An appropriate adhesive may be used as a fixing means for fixing the chips under test in the respective opening of the cutout. The thickness of the adapter plate may be slightly less than the thickness of the chip under test.

Advantageously the adapter plate, the adhesive and the chip create a vacuum-tight barrier so that all the vacuum ducts of the vacuum chuck are covered. The rear side of the chip under test has direct thermal contact to the vacuum chuck. Thus, cooling by the vacuum chuck during operation of the chip is enhanced. A coolant in wet-mode may even circulate directly at the chip.

A maximum thickness of the adapter plate may be the chip thickness. Special edge shapes/ducts can be used to support properties of the adhesive.

In an embodiment, the adapter plate can be customized for specific purposes to reduce test time. Multiple pre-tested chips with a specific property can be accommodated on one adapter plate.

By rapid prototyping of adapter plates a re-arrangement/replacement of chips on the adapter plate may easily be achieved.

In an embodiment, a direct thermal contact with the rear side of the at least one single chip with the vacuum chuck may be achieved which ensures efficient cooling of the chip under test.

In an embodiment, the at least one single chip may be fixed to the cutout of the adapter plate by fixing means which may comprise an adhesive. Standard adhesives, in particular ultraviolet curing adhesives, e.g. Loctite® 139 may be used for a reliable fixing of the chip in the cutout of the adapter plate. Thus, any movements of the chip during probing can be avoided.

In an embodiment, the cutout may have side walls being shaped as straight side walls or inclined side walls or convex side walls or concave side walls or stepped side walls. In an embodiment, pecial edge shapes and/or ducts may be used to support properties of the chosen adhesive for fixing the chips in the cutout of the adapter plate.

In an embodiment, the cutout may be provided with at least an alignment means on a side wall of the cutout. In particular the at least one alignment means may comprise a spring element. The alignment means may push the chip in a defined way to the side wall of the cutout. Thus, the side wall may serve as a reference for determination of the chip position.

In an embodiment, at least one corner relief may be provided in a corner connecting neighboring side walls of the cutout. The corner relief may serve for proper alignment of the chip to side walls in two rectangular dimensions of the cutout.

In an embodiment, the adapter plate may be configured with dimensions of a standard semiconductor wafer, in particular the adapter plate may have a maximum thickness being equal to a thickness of the at least one single chip. Thus, the adapter plate may be mounted instead of a standard wafer to the vacuum chuck of the standard wafer probing system. In an embodiment, adaptation of the wafer probing system for testing the single chips may be minimized.

In an embodiment of the invention, additionally or alternatively the adapter plate may be configured with a unique identification data providing at least a plate type and/or a unique identification and/or coordinates of the at least one cutout for at least one single chip.

Each adapter plate may have a unique prober-readable identification data, e.g. such as labelling, for plate type and identification. Thus, chip positions and orientations may be stored in a controller of the wafer probing system and used for adjusting the position of the vacuum chuck for a correct probing of the chip under test.

In an embodiment, the identification data, e.g. label, may at least provide a unique product name, a fixed identifier, grid step sizes, an origin point of a top left position of a cutout on the adapter plate, opening dimensions of one or more cutouts, and a number of cutouts in different directions of the surface of the adapter plate. Thus, all necessary information for testing the single chips in the standard wafer probing system may be provided by a standardized identification data of the adapter plate to the controller of the wafer probing system.

BRIEF DESCRIPTION OF THE SEVERAL VIEWS OF THE DRAWINGS

The present invention together with the above-mentioned and other objects and advantages may best be understood from the following detailed description of the embodiments, but not restricted to the embodiments.

DETAILED DESCRIPTION

Figure 1:
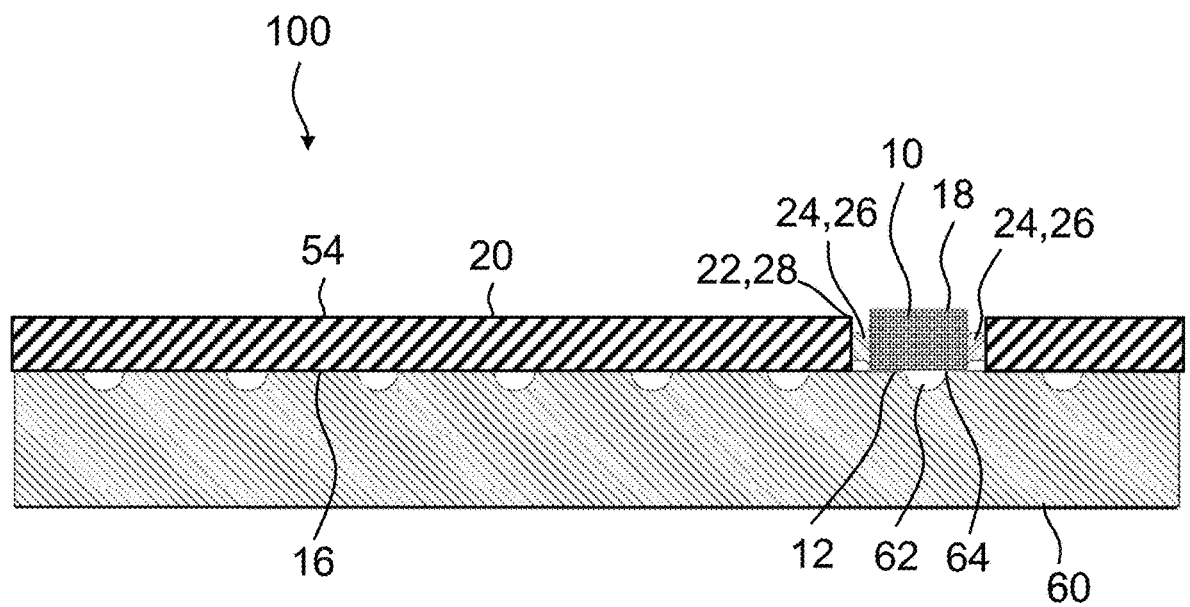
FIG. 1 depicts a cross section through a device with an adapter plate accommodating a chip in a cutout mounted to a vacuum chuck according to an embodiment of the invention.
Figure 2:
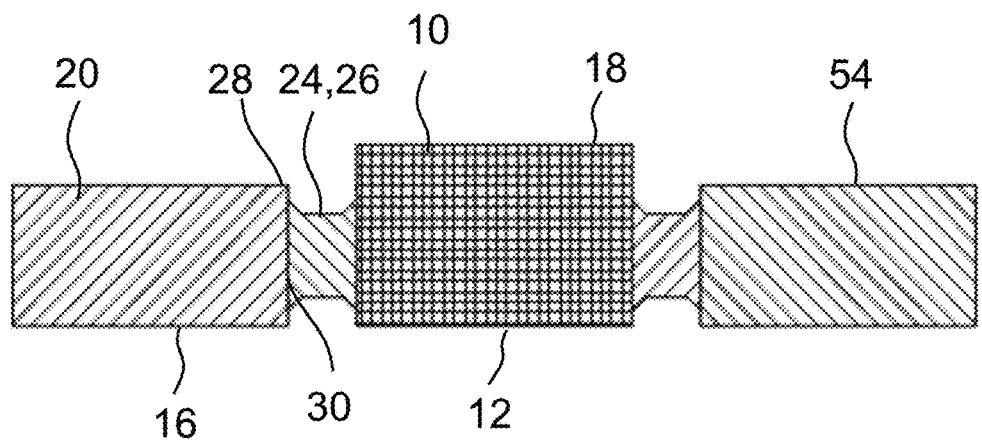
FIG. 2 depicts a cross section through an adapter plate accommodating a chip according to an embodiment of the invention with a side wall of the cutout shaped with a straight cross section.

In the drawings, like elements are referred to with equal reference numerals. The drawings are merely schematic representations, not intended to portray specific parameters of the invention. Moreover, the drawings are intended to depict only typical embodiments of the invention and therefore should not be considered as limiting the scope of the invention.

The illustrative embodiments described herein provide a device for testing at least one single chip in a wafer probing system with a method, providing: (i) an adapter plate for accommodating at least one single chip in a cutout of the adapter plate with a rear surface of the at least one chip being flush with an interface surface of the adaption plate, (ii) a vacuum chuck for applying vacuum to the adapter plate, (iii) probes of the wafer probing system for testing the at least one single chip mounted to the adapter plate, (iv) a single chip fixing means for fixing the at least one single chip in the cutout of the adapter plate in a vacuum-tight manner, the fixing means additionally applied to the at least one single chip arranged in the cutout.

The rear surface of the adapter plate is smooth and adapted for a vacuum tight arrangement on the vacuum chuck.

The illustrative embodiments may further be used for a method for testing at least one single chip in a wafer probing system, at least comprising: (i) providing an adapter plate having an interface surface for contacting a vacuum chuck of the wafer probing system, the adapter plate being configured to accommodate the at least one single chip in a cutout with a chip rear surface being flush with the interface surface; (ii) loading the adapter plate with the at least one single chip into the wafer probing system; (iii) reading an identification data of the loaded adapter plate; (iv) storing the identification data of the loaded adapter plate in a controller of the wafer probing system; (v) moving the vacuum chuck together with the adapter plate to a predefined search area for probes of the wafer probing system; (vi) determining an exact position of the at least one single chip in the adapter plate in the search area; (vii) adjusting the position of the vacuum chuck until a front surface of the at least one single chip is in an operational region for being contacted by the probes of the wafer probing system; (viii) adding the adjusted position of the vacuum chuck corresponding to the at least one single chip positioned in the operational region to the stored identification data of the loaded adapter plate; (ix) contacting the at least one single chip electrically with probes of the wafer probing system; (x) testing the at least one single chip with test routines stored in a controller of the wafer probing system.

FIG. 1 depicts a cross section through a device 100 with an adapter plate 20 accommodating a chip 10 in a cutout 28 mounted to a vacuum chuck 60 according to an embodiment of the invention.

The device 100 for testing at least one single chip 10 in a wafer probing system provides an adapter plate 20 for accommodating at least one single chip 10 in a cutout 28 of the adapter plate 20 with a rear surface 12 of the at least one chip 10 being flush with an interface surface 16 of the adaption plate 20.

Further the device 100 provides a vacuum chuck 60 for applying vacuum to the adapter plate 20 and probes (not shown) of the wafer probing system for testing the at least one single chip 10 mounted to the adapter plate 20.

Further the device 100 provides a single chip fixing means 24 for fixing the at least one single chip 10 in the cutout 28 of the adapter plate 20 in a vacuum-tight manner. The fixing means 24 are additionally applied to the at least one single chip 10 arranged in the cutout 28. The fixing means 24 comprises an adhesive 26.

The rear surface 12 of the at least one single chip 10 is in direct thermal contact 64 with the vacuum chuck 60. Thus, a direct thermal contact 64 with the rear side of the at least one single chip 10 with the vacuum chuck 60 is achieved. Further the at least one single chip 10 may be cooled by a coolant, in particular in wet-mode circulating directly at the chip 10.

FIGS. 2 to 6 depict a cross section through an adapter plate 20 accommodating a chip 10 according to embodiments of the invention with different side wall shapes of the cutouts 28.

The side walls 30, 32, 34, 36, 37 of the cutouts 28 are shaped in a different manner to show the various possibilities of shaping the side walls 30, 32, 34, 36, 37 according to requirements of the adhesive 26. The free space between the side walls 30, 32, 34, 36, 37 are filled with an appropriate adhesive 26. Thus, a straight side wall 30 or an inclined side wall 32 or a convex side wall 34 or a concave side wall 36 or a stepped side wall may be implemented to enhance the adhesive properties of the fixing means 24.

The method for testing at least one single chip 10 in a wafer probing system, at least comprises providing an adapter plate 20 having an interface surface 16 for contacting a vacuum chuck 60 of the wafer probing system. The adapter plate 20 is configured to accommodate a number of single chips 10 in cutouts 28 with a chip rear surface 12 being flush with the interface surface 16. The adapter plate 20 with the single chips 10 is loaded into the wafer probing system. Identification data, e.g. data of a label 48, of the loaded adapter plate 20 are read. The identification data, e.g. data of the label 48, of the loaded adapter plate 20 are stored in a controller of the wafer probing system. The vacuum chuck 60 is moved together with the adapter plate 20 to a predefined search area 50 for probes of the wafer probing system. An exact position of the at least one single chip 10 in the adapter plate 20 in the search area 50 is determined. The position of the vacuum chuck 60 is adjusted until a front surface 54 of the at least one single chip 10 is in an operational region 66 for being contacted by the probes of the wafer probing system. The adjusted position of the vacuum chuck 60 corresponding to the at least one single chip 10 positioned in the operational region 66 is added to the stored identification data, e.g. data of the label 48, of the loaded adapter plate 20. The at least one single chip 10 is contacted electrically with probes of the wafer probing system. The at least one single chip 10 is tested with test routines stored in a controller of the wafer probing system.

The steps from moving the vacuum chuck 60 to a predefined search area 50 to testing the chip 10 are repeated for every single chip 10 that is mounted to the loaded adapter plate 20.

Figure 7:
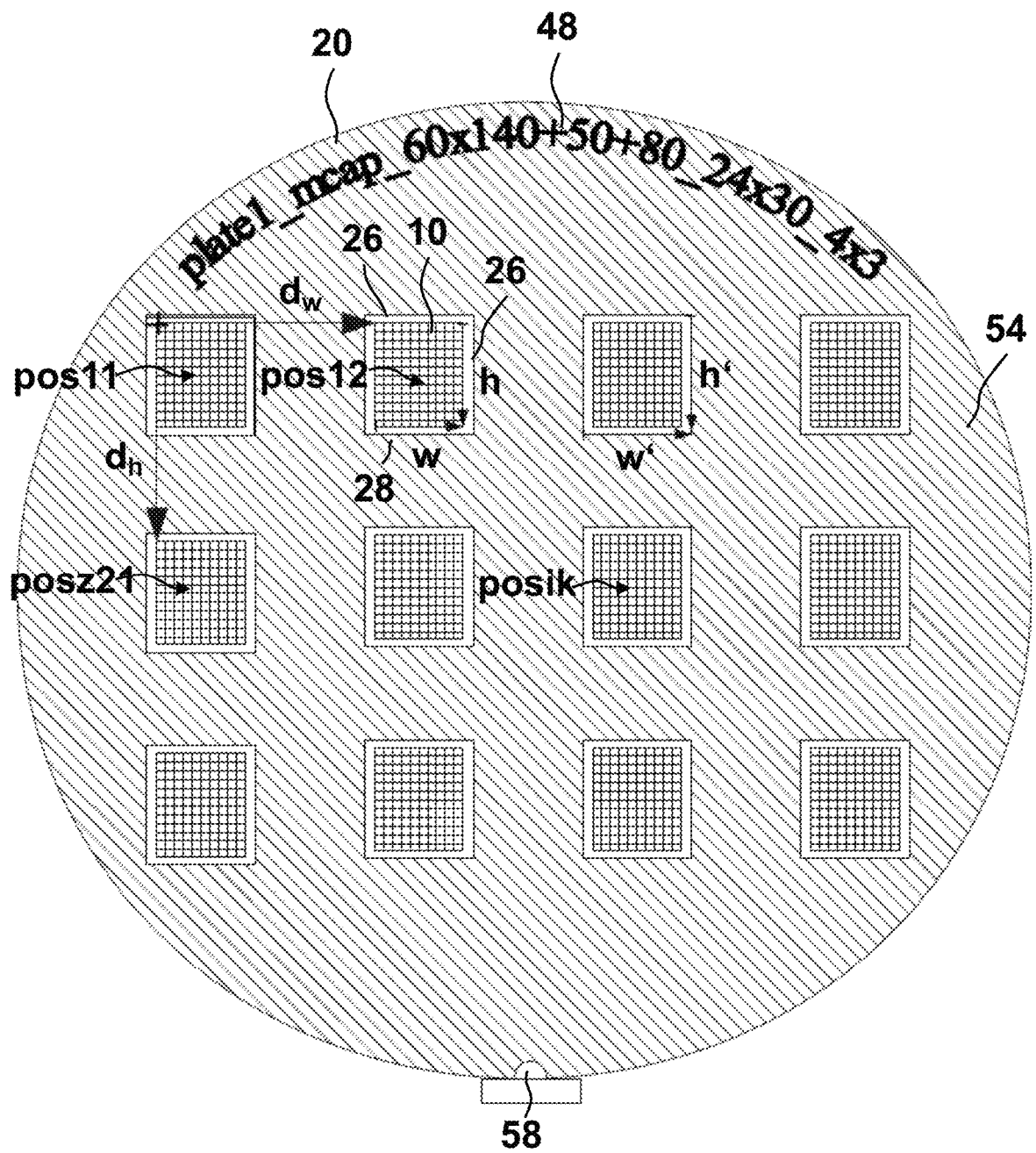
FIG. 7 depicts a top view of an adapter plate with a number of cutouts accommodating chips according to a further embodiment of the invention.

FIG. 7 depicts a top view of an adapter plate 20 with a number of cutouts 28 accommodating chips 10 according to a further embodiment of the invention.

The adapter plate 20 is configured with dimensions of a standard semiconductor wafer. In particular the adapter plate 20 has a maximum thickness being equal to a thickness of the at least one single chip 10. The adapter plate 20 may be mounted to a vacuum chuck 60 supporting alignment by an alignment mark 58 shaped as a cutout.

To support auto-levelling and correct chip map stepping of the adapter plate 20 on the vacuum chuck 60 the distance and angle recognition system of the wafer probing system may support the adapter plate 20. For the single chip application the existing positioning algorithm for legacy broken wafer kits can be used. For an apparatus with multiple cutouts 28 in a regular grid with columns and rows the positioning algorithm may be adapted to find the correct chip locations on the adapter plate 20. For testing a first chip pin needs to be always at the same relative location, e.g. at a top-left position of the chip 10.

Plate coordinates are documented in the identification data of the plate, e.g. in the plate label 48.

The adapter plate 20 of the embodiment shown in FIG. 7 is configured with a unique identification data such as a label 48 providing at least a plate type and/or a unique identification and/or coordinates of the at least one cutout 28 for at least one single chip 10. The identification data, e.g. a label 48, at least may provide a unique product name, a fixed identifier, grid step sizes, an origin point of a top left position of a cutout 28 on the adapter plate 20, opening dimensions of one or more cutouts 28, and a number of cutouts 28 in different directions of the surface 54 of the adapter plate 20.

Figure 3:
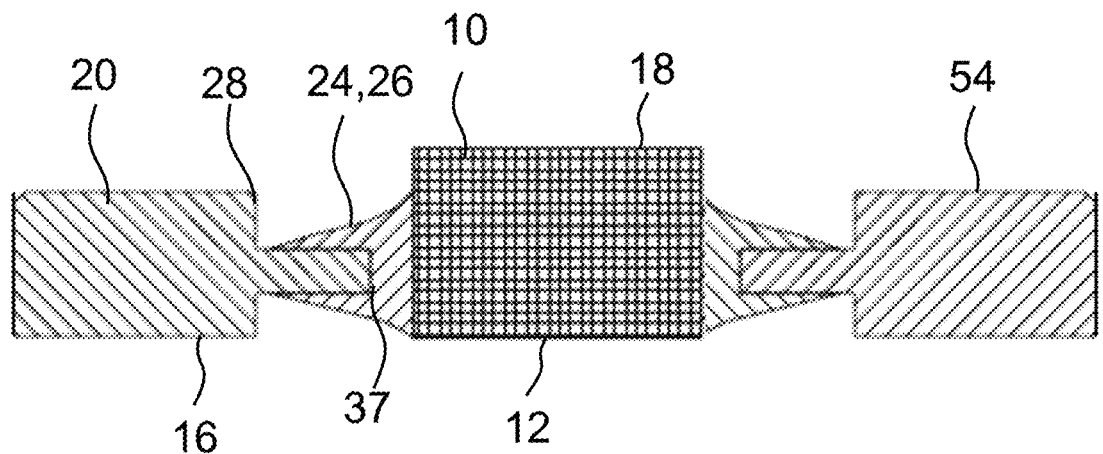
FIG. 3 depicts a cross section through an adapter plate accommodating a chip according to a further embodiment of the invention with a side wall of the cutout shaped with a stepped cross section.
Figure 4:
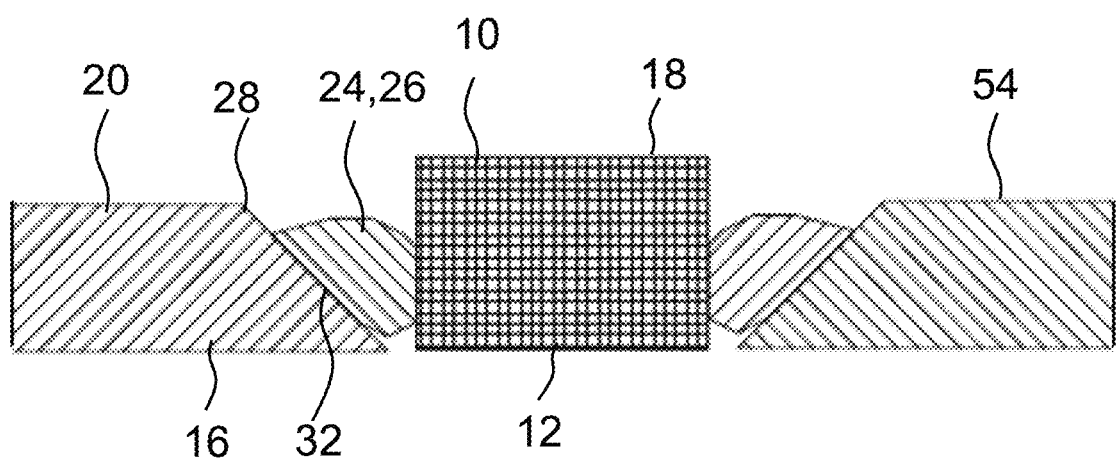
FIG. 4 depicts a cross section through an adapter plate accommodating a chip according to a further embodiment of the invention with a side wall of the cutout shaped with an inclined cross section.
Figure 5:
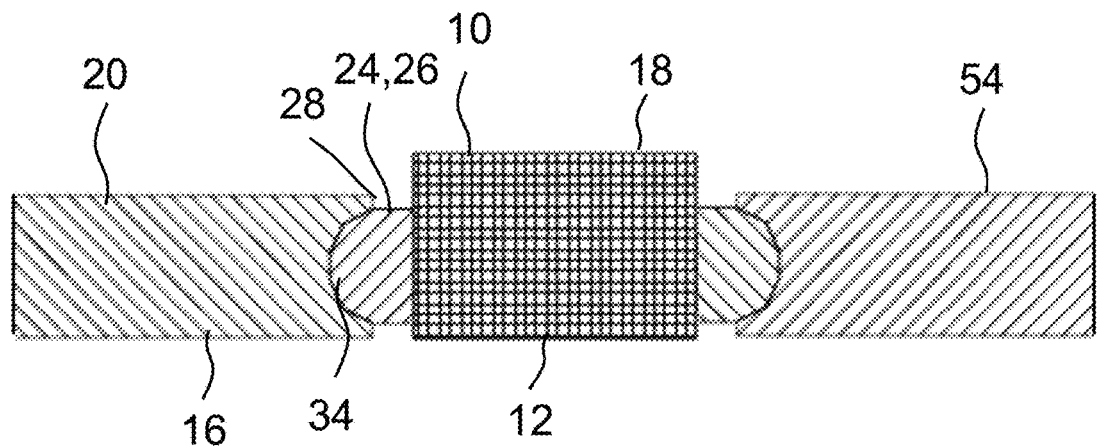
FIG. 5 depicts a cross section through an adapter plate accommodating a chip according to a further embodiment of the invention with a side wall of the cutout shaped with a convex cross section.
Figure 6:
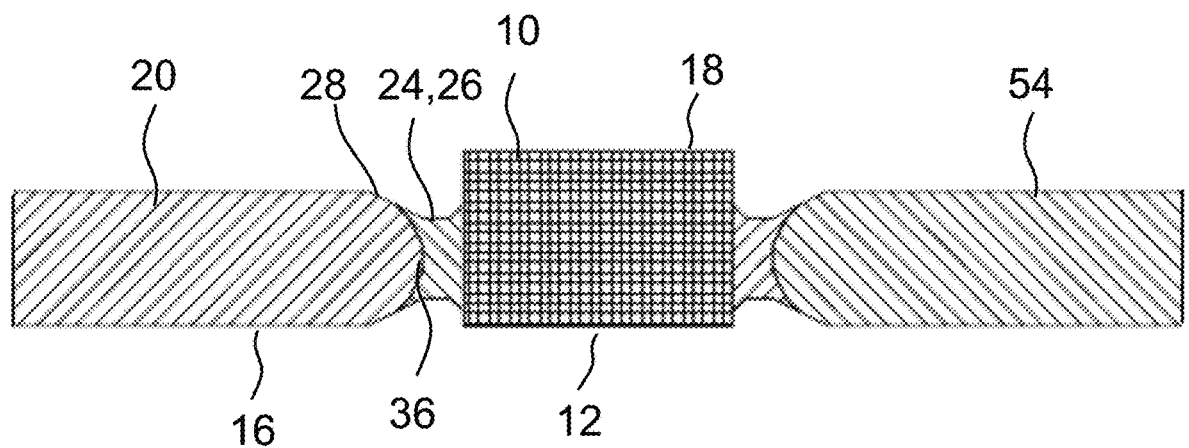
FIG. 6 depicts a cross section through an adapter plate accommodating a chip according to a further embodiment of the invention with a side wall of the cutout shaped with a concave cross section.

The adapter plate identification data, e.g. label 48, of the embodiment depicted in FIG. 3 is formatted as $<name>\_mcap\_<dw>x<dh>+<ox>+$
$<oy>\_<w'>x<h'>\_<\#w>x<\#h>$, where <name>: a unique product name="plate 1"
mcap: fixed identifier→this is a multi-chip adapter plate (software hint)
<dw>x<dh>: grid step sizes [mm]=60*140
<ox>+<oy>: origin point of pos11 position on the adapter plate [mm]=50+80
<w'>x<h'>: opening dimensions [mm]=24*30
<#w>x<#h>: number of chips in orthogonal directions w and h=4*3.

Figure 8:
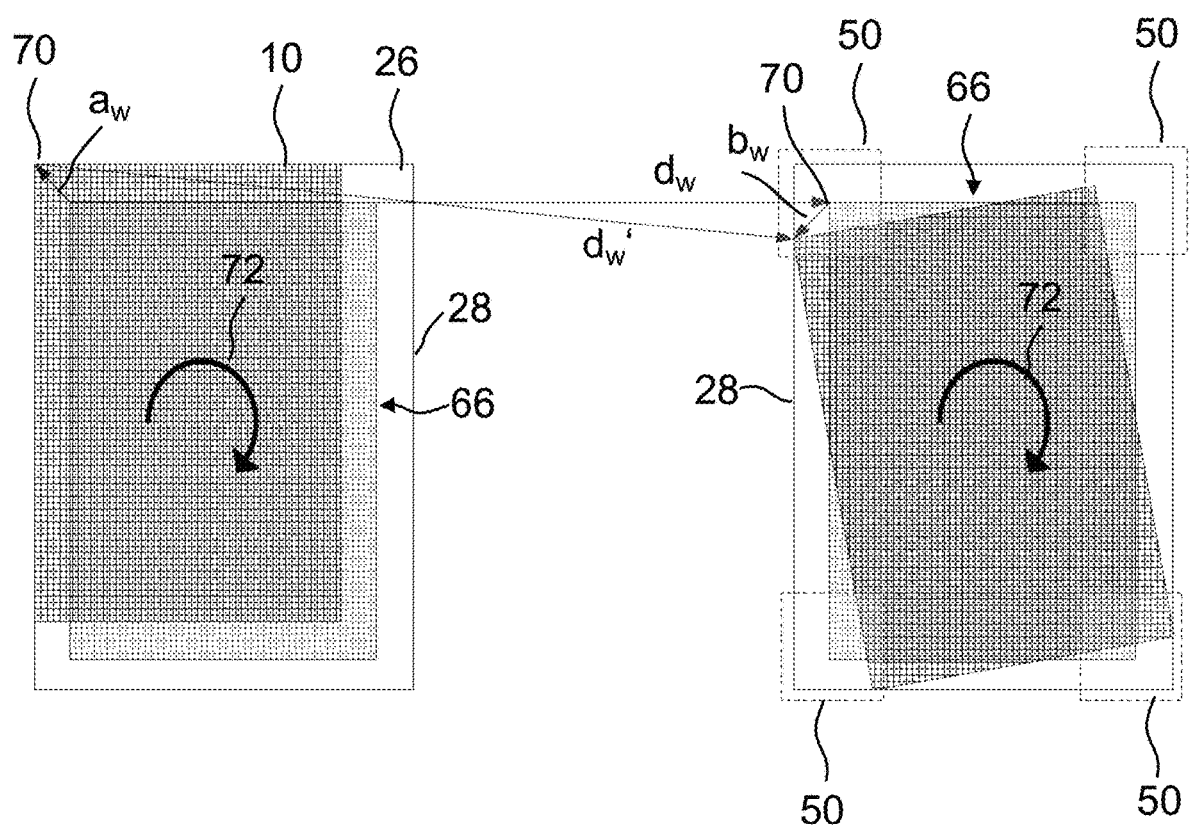
FIG. 8 depicts chips in different positions in the cutouts of the adapter plate.

Chip dimensions are w*h. The size of the cutout 28 is w'*h', as marked in two cutouts 28 in FIG. 7. This gives an adhesive thickness on each side of (h'−h)/2 and (w'−w)/2. Within this adhesive thickness the chip can be slightly shifted and rotated due to manufacturing inaccuracies and tolerances as shown in FIG. 8. The software must be prepared to adjust position for a grid width offset of $\vec{d_{w'}} = \vec{a_w} \cdot \vec{d_w} \cdot \vec{b_w}$
and a grid height offset of $\vec{d_{h'}} = \vec{a_h} \cdot \vec{d_h} \cdot \vec{b_h}$
respectively. This offset changes for each position, so for the example of FIG. 7 a total of 12 offset coordinates 70 and rotation coordinates 72 need to be stored in the wafer prober. The vectors $\vec{a_h}, \vec{b_h}, \vec{a_w}, \vec{b_w}$ as shown in FIG. 8, are a placeholder for positioning errors between two adjacent chip positions, like pos11/pos21, pos11/pos12.

FIG. 8 depicts chips 10 in different positions in the cutouts 28 of the adapter plate 20.

A pattern 52 may be defined on a front surface 18 of the at least one single chip 10 which is suitable for adjusting the position 70 and/or the rotation angle 72 of the at least one single chip 10.

Figure 10:
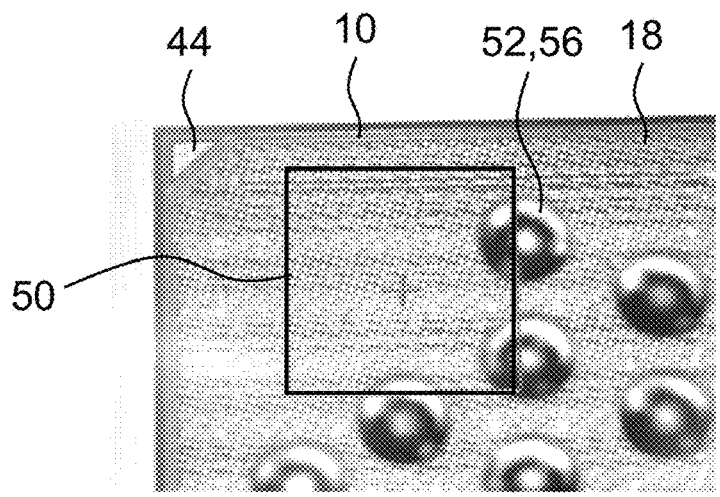
FIG. 10 depicts a part of a chip surface carrying soldering balls with a search area of a wafer probing system marked according to a further embodiment of the invention.

The pattern 52 may comprise topological features on the front surface 18 of the at least one single chip 10, in particular features such as soldering balls 56 and/or optical high contrast structures which is shown in FIG. 10.

At least one search area 50 may be defined for finding a match of the pattern 52 with the position 70 of the at least one single chip 10. In an embodiment, the search area 50 may be defined for each corner of a rectangular chip 10. Thus, at least a chip position 70 and/or a rotation angle 72 may be determined from a match of the at least one search area 50 with the pattern 52 and stored to a product data database 74.

Due to a further embodiment the exact position 70 of the at least one single chip 10 may be determined manually with a camera system or automatically with a camera system or automatically with a camera system and a positioning algorithm.

Figure 9:
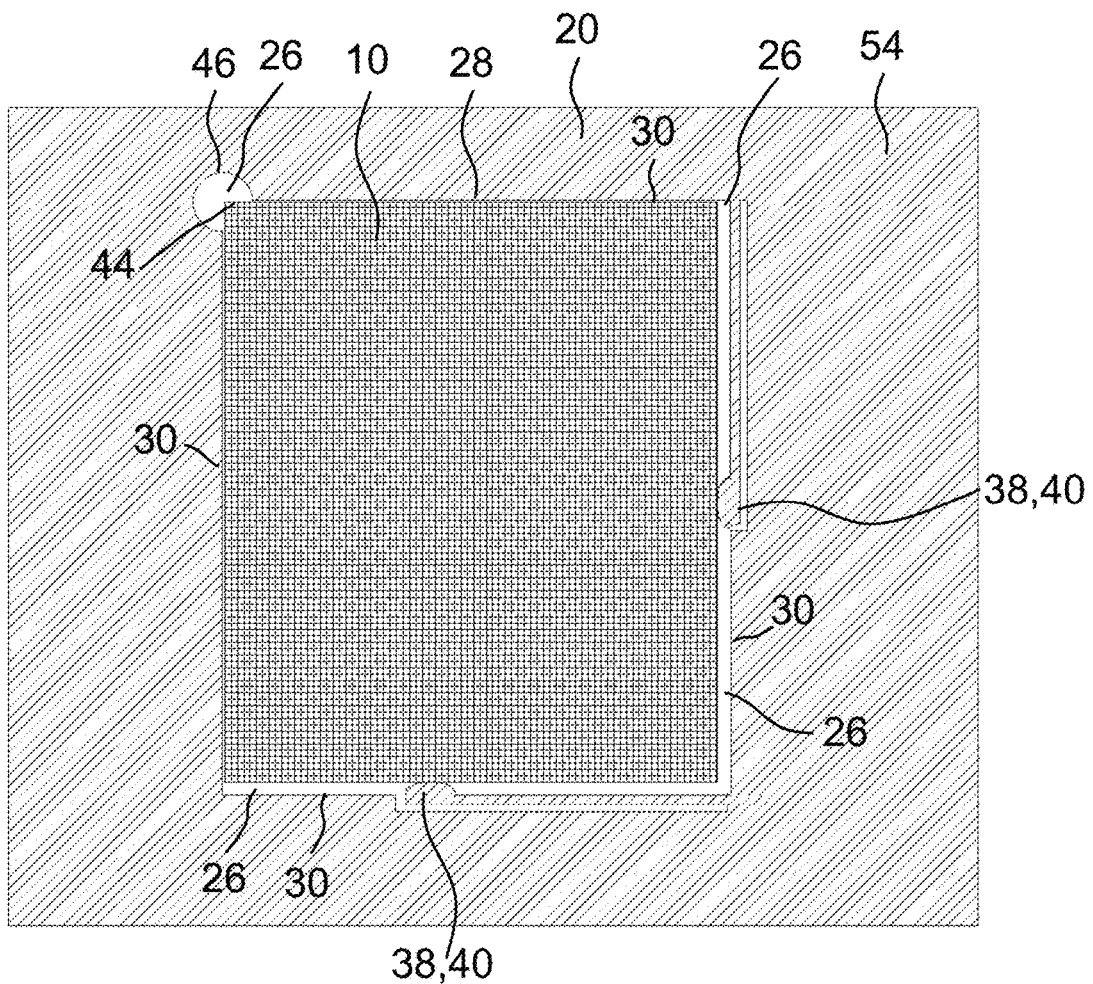
FIG. 9 depicts a cutout of an adapter plate with alignment means according to a further embodiment of the invention.

FIG. 9 depicts a cutout 28 of an adapter plate 20 with alignment means 38 according to a further embodiment of the invention.

The cutout 28 is provided with at least an alignment means 38 on a side wall 30, 32, 34, 36 of the cutout 28. In particular the alignment means 38 comprises spring elements 40 as shown in FIG. 9. Further, at least one corner relief 46 is provided in a corner 44 connecting neighboring side walls 30, 32, 34, 36 of the cutout 28.

Two bars with rounded plungers at the end act as alignment means 38. The width between the plunger tip of the left alignment means 38 and the left side of the cutout 28 is slightly smaller than the chip width. The same holds for the chip height. The bar of the alignment means 38 acts as spring 40. This mechanism pushes the chip 10 to the top-left corner 44 of the cutout 28, aligning it with the top side and the left side of the cutout 28. This reduces the absolute value of the grid misalignment vectors $\vec{a_h}$, $\vec{b_h}$, $\vec{a_w}$, $\vec{b_w}$ as shown in FIG. 8. The top left corner relief 46 may serve for a good alignment result. Open spaces between the chip 10 and the adapter plate 20 are filled with the adhesive 26 in order to enable fixing of the chip 10 by vacuum applied to the underlying vacuum chuck 60.

FIG. 10 depicts a part of a chip front surface 18 carrying soldering balls 56 with a search area 50 of a wafer probing system marked according to a further embodiment of the invention.

The positioning of the probe of the wafer probing system and the step coordinates in the wafer probing system according to state of the art are typically learned from saw marks on the wafer. For single chip probing with the adapter plate 20 this is no longer suitable since the saw mark is not existing anymore. For this purpose, the outer soldering balls 56 and neighboring optical high contrast structures may be used as a chip boundary indicator. The software of a positioning algorithm may try to find a match of the structures in a certain search area 50.

Figure 11:
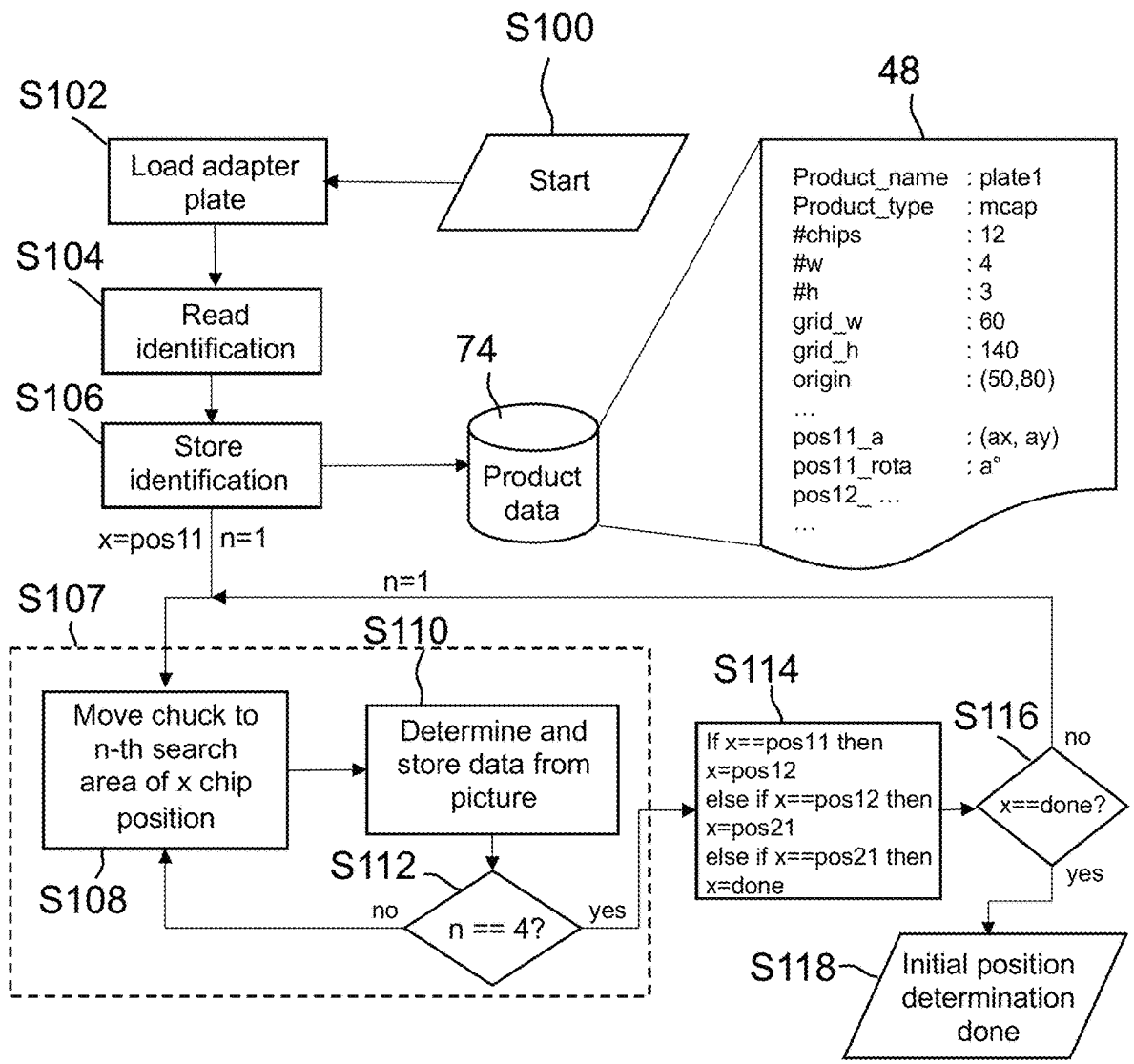
FIG. 11 depicts a flow chart of a positioning algorithm in a determination phase according to a further embodiment of the invention.

FIG. 11 depicts a flow chart of a positioning algorithm in a determination phase according to a further embodiment of the invention.

If all four search areas 50 of a chip 10, as shown in FIG. 8, are processed and a match is found for each search area 50, the chip offset a from the grid position as well as the rotation angle 72 in degrees can be calculated and become part of the adapter plate product data. The method of determining a chip position, in particular a chip position 70 and/or a rotation angle 72 on the adapter plate 20, in a determination phase of a positioning algorithm is described in FIG. 11.

The initial chip position determination, as shown in step S107 of the flow chart in FIG. 11, can be a manual step, in which four high-contrast areas, like chip corner soldering balls 56, so-called "C4 balls," are selected manually. An image for each search area 50 is stored in the product data 74. From the manual fine tuning of the soldering ball position the rotational and translational offset can be calculated by the wafer probing system and stored in the product data 74 for each position, since the C4 ball positions directly translate to a needle position on the probe.

Alternatively this may be done by an automatic step in which the wafer probing system detects the rotation and translation offsets of the chip 10.

The automatic determination of the chip position in the determination phase of the positioning algorithm may be performed by a feature matching algorithm extracting feature points of an optical image of the at least one single chip 10 for determining a translational and rotational matrix defining adjusting positions of the vacuum chuck 60.

Additionally or alternatively, a neural network, in particular a convolutional neural network, may be used in the determination phase of the positioning algorithm for determining a translational and rotational matrix defining adjusting positions of the vacuum chuck 60.

If the first initial determination phase is accomplished, the following parameters are known: a unique product name, chip dimensions, an origin (upper left grid position), a number of chips, a chip distribution on the adapter plate 20, position, offset and angle for chip positions pos11, pos12, pos21, . . . , regular grid dimensions $\vec{a_w}$, $\vec{d_h}$ .

In a second determination phase the software of the wafer probing system steps through the remaining chip positions and evaluates the offset vectors $\vec{a_{pos(ik)}}$ and rotation angles rota$_{ik}$ with i in number of columns, k in number of rows on the adapter plate 20. This information is added to the product data 74.

According to the flow chart shown in FIG. 11, after start with step S100, in step S102 the adapter plate 20 is loaded into the wafer probing system. Next in step S104 the identification data, e.g. label 48, of the adapter plate 20 is read and in step S106 the plate type as well as unique information of the adapter plate 20 stored in the product data 74.

Next in the block S107, the position determination algorithm is carried out, starting with a first chip position x=pos11 and n=1 for the first corner of the chip 10. The vacuum chuck 60 is moved in step S108 to the n-th search area 50, depicted in FIG. 8, of the x chip position, depicted in FIG. 7. Then in step S110 the determination phase of the positioning algorithm is continued and data from a picture for pattern recognition, as e.g. depicted in FIG. 10, stored in the product data 74. Typical information of identification data, e.g. of label 48, stored in the product data 74 are indicated in FIG. 11.

In step S112 it is checked if n already equals to 4. If not, n is incremented by one and step S108 repeated.

This loop is carried out until all four search areas 50 for the four corners 44 of the chip 10 are processed. Then the algorithm proceeds in step S114 to the next chip position. In step S116 it is checked if this was the last chip position. If not, the counter n is reset to one and the position determination algorithm restarted with the next chip position.

If all chip positions are done the determination algorithm exits in step S118.

In an embodiment, the adapter plate 20 can be customized for specific purposes to reduce test time. Multiple pre-tested chips 10 with a specific property can be accommodated on one adapter plate 20.

By rapid prototyping of adapter plates 20 a re-arrangement and/or replacement of chips 10 on the adapter plate 20 may easily be achieved.

By an efficient testing of single chips 10 a better archiving of the tested chips 10 is possible, because it can be sorted by chips 10 that share specific properties.

Testing with the proposed method may seamlessly integrate into a standard test flow.

Figure 12:
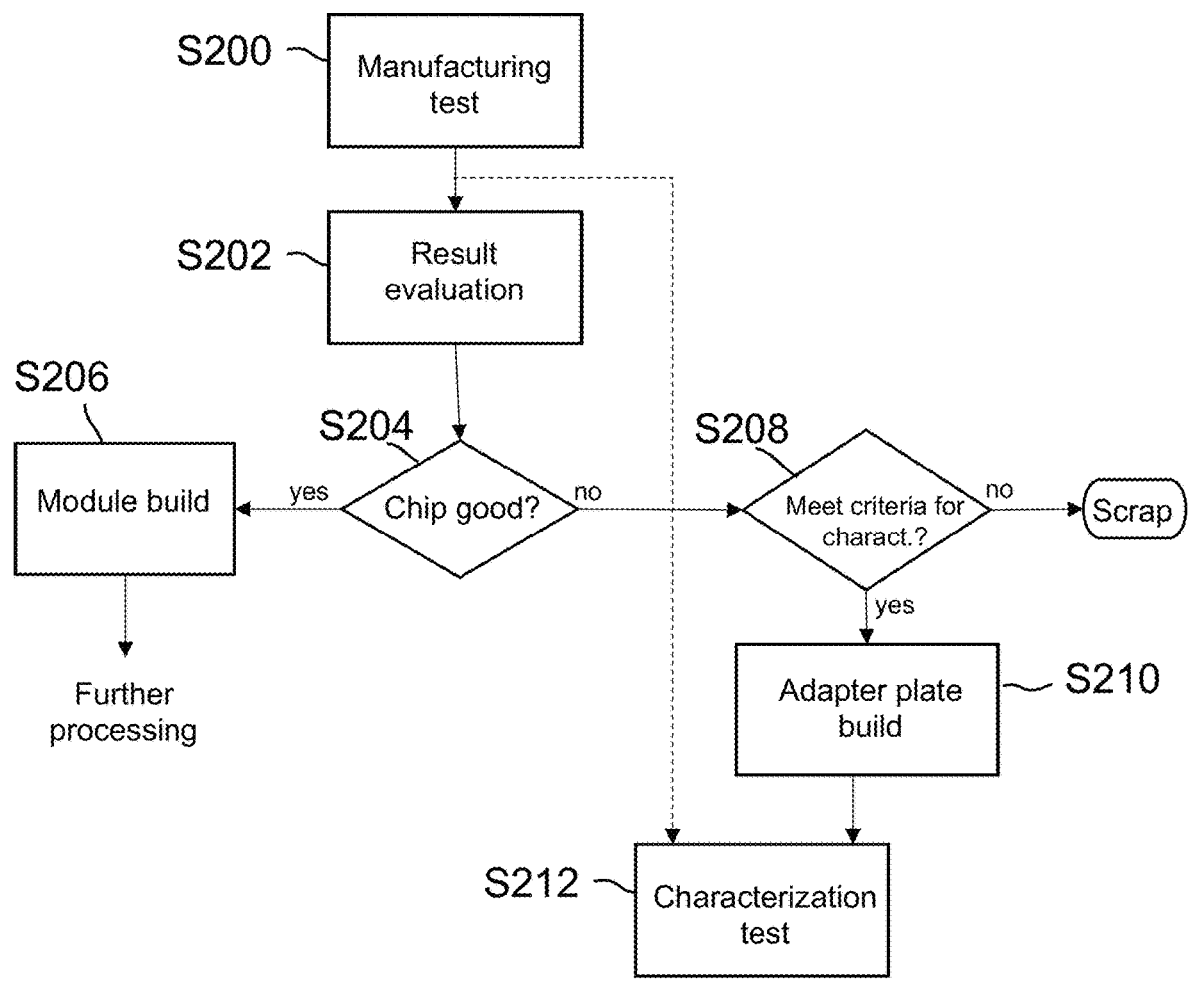
FIG. 12 depicts a test flow for testing at least one single chip in a wafer probing system according to an embodiment of the invention.

FIG. 12 depicts a test flow for testing at least one single chip 10 in a wafer probing system according to an embodiment of the invention.

As shown in the Figure testing with the adapter plate 20 according to an embodiment of the invention seamlessly integrates into a standard test flow for chips with a wafer probing system.

The standard test flow starts with a standard manufacturing test in step S200. Split hardware may be transferred directly to the characterization test in step S212. According to the normal flow in step S202 a result evaluation of the test results is done on tested wafers. From here selected wafers also may be transferred directly to the characterization test in step S212, depending on the test result.

Then, in step S204 the test flow is branched. If the test results conform with given specifications, a module may be built in step S206 which may be used for further processing.

If the test results do not conform with given specifications, in step S208 it is checked if criteria for a characterization test may be met. If this is the case an adapter plate 20 may be built in step S210 in order to be able to perform characterization tests on single chips.

Next in step S212 the standard test procedure is proceeded with a characterization test. Here the positioning algorithm already described with the embodiment shown in FIG. 10 and in more details in FIG. 11 may be applied in order to be able to carry out the characterization test in step S212.

If criteria for characterization are not met, then the test flow is ended.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Further exemplary embodiments of the present disclosure are set out in the following numbered clauses:

Numbered clause 1: A method for testing at least one single chip (10) in a wafer probing system, at least comprising:
- (i) providing an adapter plate (20) having an interface surface (16) for contacting a vacuum chuck (60) of the wafer probing system, the adapter plate (20) being configured to accommodate the at least one single chip (10) in a cutout (28) with a chip rear surface (12) being flush with the interface surface (16);
- (ii) loading the adapter plate (20) with the at least one single chip (10) into the wafer probing system;
- (iii) reading an identification data of the loaded adapter plate (20);
- (iv) storing the identification data of the loaded adapter plate (20) in a controller of the wafer probing system;
- (v) moving the vacuum chuck (60) together with the adapter plate (20) to a predefined search area (50) for probes of the wafer probing system;
- (vi) determining an exact position of the at least one single chip (10) in the adapter plate (20) in the search area (50);
- (vii) adjusting the position of the vacuum chuck (60) until a front surface (54) of the at least one single chip (10) is in an operational region (66) for being contacted by the probes of the wafer probing system;
- (viii) adding the adjusted position of the vacuum chuck (60) corresponding to the at least one single chip (10) positioned in the operational region (66) to the stored identification data of the loaded adapter plate (20);
- (ix) contacting the at least one single chip (10) electrically with probes of the wafer probing system;
- (x) testing the at least one single chip (10) with test routines stored in a controller of the wafer probing system.

Numbered clause 2: The method according to clause 1, wherein the steps (v) to (x) are repeated for every single chip (10) that is mounted to the loaded adapter plate (20).

Numbered clause 3: The method according to clause 1 or 2, further at least acquiring chip parameters, in particular a chip position (70) and/or a rotation angle (72) on the adapter plate (20), in a determination phase of a positioning algorithm.

Numbered clause 4: The method according to clause 3, further comprising:
defining a pattern (52) on a front surface (18) of the at least one single chip (10) which is suitable for adjusting the position (70) and/or the rotation angle (72) of the at least one single chip (10).

Numbered clause 5: The method according to clause 3 or 4, further comprising:
- (i) determining the exact position (70) of the at least one single chip (10) manually with a camera system or
- (ii) determining the exact position (70) of the at least one single chip (10) automatically with a camera system or
- (iii) determining the exact position (70) of the at least one single chip (10) automatically with a camera system and the positioning algorithm.

Numbered clause 6: The method according to clause 4 or 5, wherein the pattern (52) comprises topological features on the front surface (18) of the at least one single chip (10), in particular features such as soldering balls (56) and/or optical high contrast structures.

Numbered clause 7: The method according to any one of clauses 4 to 6, wherein at least one search area (50) is defined for finding a match of the pattern (52) with the position (70) of the at least one single chip (10).

Numbered clause 8: The method according to clause 7, wherein the search area (50) is defined for each corner of a rectangular chip (10).

Numbered clause 9: The method according to clause 7 or 8, wherein at least a chip position (70) and/or a rotation angle (72) is determined from a match of the at least one search area (50) with the pattern (52) and stored to a product data database (74).

Numbered clause 10: The method according to any one of clauses 3 to 9, wherein a feature matching algorithm is used in the determination phase of the positioning algorithm extracting feature points of an optical image of the at least one single chip (10) for determining a translational and rotational matrix defining adjusting positions of the vacuum chuck (60).

Numbered clause 11: The method according to any one of clauses 3 to 10, wherein a neural network, in particular a convolutional neural network, is used in the determination phase of the positioning algorithm for determining a translational and rotational matrix defining adjusting positions of the vacuum chuck (60).

Numbered clause 12: The method according to any one of clauses 1 to 11, further the identification data providing at least a plate type and/or a unique identification and/or coordinates of the at least one cutout (28) for the at least one single chip (10).

Numbered clause 13: The method according to clause 12, further the identification data at least providing
a unique product name,
a fixed identifier,
grid step sizes,
an origin point of a top left position of a cutout (28) on the adapter plate (20),
opening dimensions of one or more cutouts (28),
a number of cutouts (28) in different directions of the surface (54) of the adapter plate (20).

Numbered clause 14: A device (100) for testing at least one single chip (10) in a wafer probing system with a method according to any one of clauses 1 to 13, providing:
- (i) an adapter plate (20) for accommodating at least one single chip (10) in a cutout (28) of the adapter plate (20) with a rear surface (12) of the at least one chip (10) being flush with an interface surface (16) of the adaption plate (20),
- (ii) a vacuum chuck (60) for applying vacuum to the adapter plate (20),
- (iii) probes of the wafer probing system for testing the at least one single chip (10) mounted to the adapter plate (20),
- (iv) a single chip fixing means (24) for fixing the at least one single chip (10) in the cutout (28) of the adapter plate (20) in a vacuum-tight manner, the fixing means (24) additionally applied to the at least one single chip (10) arranged in the cutout (28).

Numbered clause 15: The device according to clause 14, wherein the fixing means (24) comprises an adhesive (26).

Numbered clause 16: The device according to clause 14 or 15, wherein the cutout (28) has side walls (30, 32, 34, 36, 37) being shaped as straight side walls (30) or inclined side walls (32) or convex side walls (34) or concave side walls (36) or stepped side walls (37).

Numbered clause 17: The device according to any one of clauses 14 to 16, wherein the cutout (28) is provided with at least an alignment means (38) on a side wall (30, 32, 34, 36, 37) of the cutout (28), in particular wherein the at least one alignment means (38) comprises a spring element (40).

Numbered clause 18: The device according to clause 16 or 17, wherein at least one corner relief (46) is provided in a corner (44) connecting neighboring side walls (30, 32, 34, 36, 37) of the cutout (28).

Numbered clause 19: The device according to any one of clauses 14 to 18, wherein the adapter plate (20) is configured with dimensions of a standard semiconductor wafer, in particular wherein the adapter plate (20) has a maximum thickness being equal to a thickness of the at least one single chip (10).

Numbered clause 20: The device according to any one of clauses 14 to 19, wherein the rear surface (12) of the at least one single chip (10) is in direct thermal contact (64) with the vacuum chuck (60).

Numbered clause 21: The device according to any one of clauses 14 to 20, wherein the at least one single chip (10) is cooled by a coolant, in particular in wet-mode circulating directly at the chip (10).

Numbered clause 22: The device according to any one of clauses 14 to 21, wherein the adapter plate (20) is configured with a unique identification data providing at least a plate type and/or a unique identification and/or coordinates of the at least one cutout (28) for at least one single chip (10).

Numbered clause 23: The device according to clause 22, further the identification data at least providing
  a unique product name,
  a fixed identifier,
  grid step sizes,
  an origin point of a top left position of a cutout (28) on the adapter plate (20),
  opening dimensions of one or more cutouts (28),
  a number of cutouts (28) in different directions of the surface (54) of the adapter plate (20).

Numbered clause 24: An adapter plate (20) for a device (100) for testing at least one single chip (10) in a wafer probing system according to any one of clauses 13 to 23, the adapter plate (20) at least providing:
  at least one cutout (28) in the adapter plate (20) for accommodating the at least one single chip (10),
  an interface surface (16) of the adapter plate (20) intended to being flush with a rear surface (12) of the at least one chip (10),
  the interface surface (16) being configured for being mounted on a vacuum chuck (60) for applying vacuum to the adapter plate (20).

Numbered clause 25: The adapter plate according to clause 24, being configured with a unique identification data providing at least a plate type and/or a unique identification and/or coordinates of the at least one cutout (28) for at least one single chip (10).

What is claimed is:

1. A method for testing at least one single chip in a wafer probing system, at least comprising:
  providing an adapter plate having an interface surface for contacting a vacuum chuck of the wafer probing system, the adapter plate being configured to accommodate the at least one single chip in a cutout with a chip rear surface being flush with the interface surface;
  loading the adapter plate with the at least one single chip into the wafer probing system;
  reading an identification data of the loaded adapter plate;
  storing the identification data of the loaded adapter plate in a controller of the wafer probing system;
  moving the vacuum chuck together with the adapter plate to a predefined search area for probes of the wafer probing system;
  determining an exact position of the at least one single chip in the adapter plate in the search area;
  adjusting the position of the vacuum chuck until a front surface of the at least one single chip is in an operational region for being contacted by the probes of the wafer probing system;
  adding the adjusted position of the vacuum chuck corresponding to the at least one single chip positioned in the operational region to the stored identification data of the loaded adapter plate;
  contacting the at least one single chip electrically with probes of the wafer probing system; and
  testing the at least one single chip with test routines stored in a controller of the wafer probing system,
  wherein chip parameters, in particular a chip position and/or a rotation angle on the adapter plate, are acquired in a determination phase of a positioning algorithm, and further comprising:
  defining a pattern on a front surface of the at least one single chip which is suitable for adjusting the position and/or the rotation angle of the at least one single chip,
  wherein at least one search area is defined for finding a match of the pattern with the position of the at least one single chip.

2. The method according to claim 1, wherein the moving step, the determining step, the adjusting step, the adding step, the contacting step, and the testing step are repeated for every single chip that is mounted to the loaded adapter plate.

3. The method according to claim 1, further comprising:
  determining the exact position of the at least one single chip, wherein the determining is performed, manually with a camera system, automatically with a camera system, or automatically with a camera system and the positioning algorithm.

4. The method according to claim 1, wherein the pattern comprises topological features on the front surface of the at least one single chip, where the topological features are selected from a group consisting of soldering balls and/or optical high contrast structures.

5. The method according to claim 1, wherein the search area is defined for each corner of a rectangular chip.

6. The method according to claim 1, wherein at least a chip position and/or a rotation angle is determined from a match of the at least one search area with the pattern and stored to a product data database.

7. The method according to claim 1, wherein a feature matching algorithm is used in the determination phase of the positioning algorithm extracting feature points of an optical image of the at least one single chip for determining a translational and rotational matrix defining adjusting positions of the vacuum chuck.

8. The method according to claim 1, wherein a neural network, is used in the determination phase of the positioning algorithm for determining a translational and rotational matrix defining adjusting positions of the vacuum chuck.

9. The method according to claim 1, wherein the identification data is selected from a group consisting of a plate type, a unique identification, and coordinates of the at least one cutout for the at least one single chip.

10. The method according to claim 9, wherein the identification data is selected from a group consisting of a fixed identifier, grid step sizes, an origin point of a top left position of a cutout on the adapter plate, opening dimensions of one or more cutouts, and a number of cutouts in different directions of the surface of the adapter plate.

11. A device for testing at least one single chip in a wafer probing system, providing:
  an adapter plate for accommodating at least one single chip in a cutout of the adapter plate with a rear surface of the at least one chip being flush with an interface surface of the adaption plate;
  a vacuum chuck for applying vacuum to the adapter plate;
  probes of the wafer probing system for testing the at least one single chip mounted to the adapter plate;
  a single chip fixing means for fixing the at least one single chip in the cutout of the adapter plate in a vacuum-tight manner, the fixing means additionally applied to the at least one single chip arranged in the cutout; and
  wherein the device is capable of performing a method comprising:
    providing an adapter plate having an interface surface for contacting a vacuum chuck of the wafer probing system, the adapter plate being configured to accommodate the at least one single chip in a cutout with a chip rear surface being flush with the interface surface;
    loading the adapter plate with the at least one single chip into the wafer probing system;
    reading an identification data of the loaded adapter plate;
    storing the identification data of the loaded adapter plate in a controller of the wafer probing system;
    moving the vacuum chuck together with the adapter plate to a predefined search area for probes of the wafer probing system;
    determining an exact position of the at least one single chip in the adapter plate in the search area;
    adjusting the position of the vacuum chuck until a front surface of the at least one single chip is in an operational region for being contacted by the probes of the wafer probing system;
    adding the adjusted position of the vacuum chuck corresponding to the at least one single chip positioned in the operational region to the stored identification data of the loaded adapter plate;
    contacting the at least one single chip electrically with probes of the wafer probing system; and
    testing the at least one single chip with test routines stored in a controller of the wafer probing system,
    wherein chip parameters, in particular a chip position and/or a rotation angle on the adapter plate, are acquired in a determination phase of a positioning algorithm, and further comprising:
      defining a pattern on a front surface of the at least one single chip which is suitable for adjusting the position and/or the rotation angle of the at least one single chip,
      wherein at least one search area is defined for finding a match of the pattern with the position of the at least one single chip.

12. The device according to claim 11, wherein the fixing means comprises an adhesive.

13. The device according to claim 11, wherein the cutout has side walls being shaped as straight side walls or inclined side walls or convex side walls or concave side walls or stepped side walls.

14. The device according to claim 11, wherein the cutout is provided with at least an alignment means on a side wall of the cutout, in particular wherein the at least one alignment means comprises a spring element.

15. The device according to claim 13, wherein at least one corner relief is provided in a corner connecting neighboring side walls of the cutout.

16. The device according to claim 11, wherein the adapter plate is configured with dimensions of a standard semiconductor wafer, and wherein the adapter plate has a maximum thickness being equal to a thickness of the at least one single chip.

17. The device according to claim 11, wherein the rear surface of the at least one single chip is in direct thermal contact with the vacuum chuck.

18. The device according to claim 11, wherein the at least one single chip is cooled by a coolant, and wherein the coolant, in wet-mode, circulates directly at the chip.

19. The device according to claim 11, wherein the adapter plate is configured with a unique identification data providing at least a plate type and/or a unique identification and/or coordinates of the at least one cutout for at least one single chip.

20. The device according to claim 19, wherein the identification data is selected from a group consisting of a unique product name, a fixed identifier, grid step sizes, an origin point of a top left position of a cutout on the adapter plate, opening dimensions of one or more cutouts, and a number of cutouts in different directions of the surface of the adapter plate.

21. A computer program product, the computer program product comprising:
  one or more computer-readable tangible storage media and program instructions stored on at least one of the one or more tangible storage media, the program instructions executable by a processor capable of performing a method, the method comprising:
    providing an adapter plate having an interface surface for contacting a vacuum chuck of the wafer probing system, the adapter plate being configured to accommodate the at least one single chip in a cutout with a chip rear surface being flush with the interface surface;
    loading the adapter plate with the at least one single chip into the wafer probing system;
    reading an identification data of the loaded adapter plate;
    storing the identification data of the loaded adapter plate in a controller of the wafer probing system;
    moving the vacuum chuck together with the adapter plate to a predefined search area for probes of the wafer probing system;
    determining an exact position of the at least one single chip in the adapter plate in the search area;
    adjusting the position of the vacuum chuck until a front surface of the at least one single chip is in an operational region for being contacted by the probes of the wafer probing system;
    adding the adjusted position of the vacuum chuck corresponding to the at least one single chip positioned in the operational region to the stored identification data of the loaded adapter plate;
    contacting the at least one single chip electrically with probes of the wafer probing system; and
    testing the at least one single chip with test routines stored in a controller of the wafer probing system,
    wherein chip parameters, in particular a chip position and/or a rotation angle on the adapter plate, are acquired in a determination phase of a positioning algorithm, and further comprising:

defining a pattern on a front surface of the at least one single chip which is suitable for adjusting the position and/or the rotation angle of the at least one single chip, wherein at least one search area is defined for finding a match of the pattern with the position of the at least one single chip.

22. The computer program product of claim 21, wherein the moving step, the determining step, the adjusting step, the adding step, the contacting step, and the testing step are repeated for every single chip that is mounted to the loaded adapter plate.

23. The computer program product of claim 21, wherein the method further comprises:

determining the exact position of the at least one single chip, wherein the determining is performed, manually with a camera system, automatically with a camera system, or automatically with a camera system and the positioning algorithm.

24. The computer program product of claim 21, wherein the pattern comprises topological features on the front surface of the at least one single chip, where the topological features are selected from a group consisting of soldering balls and/or optical high contrast structures.

25. The computer program product of claim 21, wherein the search area is defined for each corner of a rectangular chip.

* * * * *